United States Patent
Li et al.

(10) Patent No.: US 11,029,367 B2
(45) Date of Patent: Jun. 8, 2021

(54) METHOD FOR IDENTIFYING FAULT TYPES OF HIGH VOLTAGE DIRECT CURRENT TRANSMISSION LINE

(71) Applicant: TIANJIN UNIVERSITY, Tianjin (CN)

(72) Inventors: Bin Li, Tianjin (CN); Hong Qiu, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 0 days.

(21) Appl. No.: 16/314,260

(22) PCT Filed: Jan. 29, 2018

(86) PCT No.: PCT/CN2018/074454
§ 371 (c)(1),
(2) Date: Dec. 28, 2018

(87) PCT Pub. No.: WO2018/233294
PCT Pub. Date: Dec. 27, 2018

(65) Prior Publication Data
US 2020/0158787 A1 May 21, 2020

(30) Foreign Application Priority Data

Jun. 19, 2017 (CN) .......................... 201710467219.6

(51) Int. Cl.
*G01R 31/58* (2020.01)
*G01R 31/52* (2020.01)

(52) U.S. Cl.
CPC ............. *G01R 31/52* (2020.01); *G01R 31/58* (2020.01)

(58) Field of Classification Search
CPC .......... G01R 31/52; G01R 31/58; G01R 1/00; G01R 3/00; G01R 15/00; G01R 19/00;
(Continued)

(56) References Cited

U.S. PATENT DOCUMENTS

2017/0117701 A1* 4/2017 Johannesson .......... H02H 7/265

FOREIGN PATENT DOCUMENTS

CN 1870378 A 11/2006
CN 102255293 A 11/2011
(Continued)

OTHER PUBLICATIONS

Zheng, Xiaodong, Tai, Nengling, Yang, Guangliang (WO2014/121438A1: Method and Apparatus for Current Differential Protection for UHVDC Transmission Line) (Year: 2013).*
(Continued)

*Primary Examiner* — Melissa J Koval
*Assistant Examiner* — Joseph O Nyamogo
(74) *Attorney, Agent, or Firm* — Dragon Sun Law Firm, PC; Jinggao Li, Esq.

(57) ABSTRACT

There is provided a method for identifying fault types of HVDC physical transmission line, including: measuring positive and negative voltage values and current values at a j-terminal and k-terminal of the HVDC physical transmission line, and converting them to voltage and current values under mode components; calculating differential current values of travelling wave at the j-terminal and k-terminal under zero-mode and one-mode components of the HVDC physical transmission line, respectively; comparing with the calculated differential current value at the one-mode components under the current time t and the same at time $t-t_0$ to determine whether the HVDC physical transmission line is faulty; converting differential current values of the travelling wave at the j-terminal and k-terminal under the mode components to differential current values under the maximum amount, respectively; calculating fault type coefficients of both terminals; and identifying the fault types based on the fault type coefficients.

2 Claims, 2 Drawing Sheets

(58) Field of Classification Search
CPC ........ G01R 21/00; G01R 22/00; G01R 27/00; G01R 29/00; G01R 31/00; G01R 33/00; G01R 35/00; G01B 5/00; G01B 7/00; G01B 17/00; G01B 21/00; G01D 3/00; G01D 5/00; G01H 9/00; G01H 11/00; G01J 1/00; G01J 3/00; G01J 5/00; G01K 1/00; G01K 3/00; G01K 5/00; G01K 7/00; G01K 11/00; G01K 15/00; G01K 2219/00; G01L 1/00; G01L 5/00; G01L 9/00; G01L 21/00; G01M 3/00; G01M 5/00; G01M 13/00; G01M 15/00; G01N 2291/00; G01N 3/00; G01N 5/00; G01N 9/00; G01N 17/00; G01N 21/00; G01N 22/00; G01N 23/00; G01N 24/00; G01N 25/00; G01N 27/00; G01N 29/00; G01N 31/00; G01N 33/00; G01N 2021/00; G01P 3/00; G01Q 10/00; G01Q 60/00; G01Q 70/00; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00; G06F 1/00; G06F 3/00; G06F 17/00; G06F 2200/00; G06K 7/00; G06K 9/00; G06N 3/00; G06N 10/00; G06N 20/00; G06Q 10/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G11C 29/00; G21K 1/00; G16H 30/00; G16H 50/00; H01B 3/00; H01F 1/00; H01F 17/00; H01F 27/00; H01F 29/00; H01F 2017/00; H01F 2021/00; H01H 1/00; H01H 2001/00; H01H 2009/00; H01L 21/00; H01L 22/00; H01L 23/00; H01L 24/00; H01L 25/00; H01L 27/00; H01L 29/00; H01L 31/00; H01L 33/00; H01L 41/00; H01L 43/00; H01L 45/00; H01L 49/00; H01L 51/00; H01L 2223/00; H01L 2224/00; H01L 2225/00; H01L 2251/00; H01L 2924/00; H01L 2933/00; H01P 1/00; H01P 3/00; H01P 7/00; H01P 11/00; H01Q 1/00; H01Q 3/00; H01Q 9/00; H01Q 15/00; H01Q 17/00; H01Q 21/00; H01Q 25/00; H01R 4/00; H01R 9/00; H01R 12/00; H01S 3/00; H02H 1/00; H02H 3/00; H02H 7/00; H02J 1/00; H02J 3/00; H02J 4/00; H02J 7/00; H02J 9/00; H02J 13/00; H02J 2300/00; H02M 1/00; H02M 3/00; H02M 7/00; H02M 2001/00; H02M 2003/00; H02P 5/00; H02S 50/00; H03B 5/00; H03B 17/00; H03B 19/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03K 19/00; H03L 7/00; H03L 2207/00; H03M 1/00; H04B 3/00; H04B 10/00; H04B 17/00; H04L 27/00; H04N 5/00; H04N 7/00; H04R 3/00; H04R 29/00; H04W 24/00; H05B 33/00; H05B 45/00; H05B 47/10; H05H 3/00; H05K 1/00; H05K 2201/00; H05K 3/00; H05K 7/00; Y02A 30/00; Y02A 90/00; Y02B 10/10; Y02B 20/00; Y02B 70/00; Y02B 90/00; Y02E 10/00; Y02E 40/00; Y02P 70/00; Y04S 10/00; Y04S 40/00; Y10S 977/00; Y10S 277/00; Y02T 50/00; Y10T 29/00; Y10T 428/00; Y10T 307/00; Y10T 436/00
USPC .................................................. 324/509–523
See application file for complete search history.

(56) References Cited

FOREIGN PATENT DOCUMENTS

| | | |
|---|---|---|
| CN | 105071355 A | 11/2015 |
| CN | 105403779 A | 3/2016 |
| CN | 105518958 A | 4/2016 |
| CN | 106849029 A | 6/2017 |
| JP | 06296321 A | 10/1994 |
| WO | 2014121438 A | 8/2014 |

OTHER PUBLICATIONS

Ying Zhang, Nengling Tai, and Bin Xu (Fault Analysis and Traveling-Wave Protection Scheme for Bipolar HVDC Lines) (Year: 2012).*
International Search Report of PCT/CN2018/074454.
Written Opinion of PCT/CN2018/074454.

* cited by examiner

METHOD FOR IDENTIFYING FAULT TYPES OF HIGH VOLTAGE DIRECT CURRENT TRANSMISSION LINE

CROSS-REFERENCE TO RELATED APPLICATIONS

This application is a national stage application of International Patent Application PCT/CN2018/074454, filed Jan. 29, 2018, which itself claims the priority to Chinese Patent Application No. CN 201710467219.6, filed Jun. 19, 2017 in the National Intellectual Property Administration of P. R. China, both of which are expressly incorporated by reference herein in their entirety.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

FIELD OF THE PRESENT DISCLOSURE

The present disclosure relates to the field of power system protection and control, and a method for accurately identifying fault types for a high voltage and ultrahigh voltage level direct current transmission line.

BACKGROUND OF THE PRESENT DISCLOSURE

Due to the advantages such as high transmission power, low investment and good control performance, HVDC (high voltage direct current) physical transmission has become more and more important in China's long-distance, high-capacity transmission and asynchronous-network-connecting. The HVDC grid is, as the tie line of the large-area power grid, closely related to the stable operation of the power system connected to it. Since the high-voltage direct current physical transmission line has a long transmission distance and a high probability of failure, the accurate and reliable high-voltage direct current transmission line protection technology is of great significance for the stable operation of the power system. When a high-voltage physical transmission line is failed, it is required to accurately locate and isolate the fault. At present, there are few methods for judging the type of a direct current (DC) line fault, and accurate judgment of the fault type will be helpful to locate the fault. In view of this situation, it is necessary to judge the fault type of the HVDC physical transmission line and propose a fast and reliable protection scheme.

SUMMARY OF THE PRESENT DISCLOSURE

The objective of the present disclosure is to solve the problems of identifying the fault types of the high voltage and ultrahigh voltage level direct current transmission line and to provide a fast and reliable method for identifying fault types of an HVDC physical transmission line. The technical scheme is as follows:

A method for identifying fault types of an HVDC physical transmission line, including the following steps:

(1) Measuring positive and negative voltage values $u_{jp}$, $u_{jn}$, $u_{kp}$, $u_{kn}$ and positive and negative current values $i_{jp}$, $i_{jn}$, $i_{kp}$, $i_{kn}$ at the j-terminal and k-terminal of the DC physical transmission line with a voltage meter and a current meter, respectively, and converting the measured voltage and current values under the maximum amount to voltage and current values $u_{j0}$, $u_{j1}$, $u_{k0}$, $u_{k1}$, $i_{j0}$, $i_{j1}$, $i_{k0}$, $i_{k1}$ under the mode components by employing the decoupling matrix;

(2) calculating the differential current values $dI_{j0}(t)$, $dI_{j1}(t)$, $dI_{k0}(t)$, $dI_{k1}(t)$ of the travelling wave at the j-terminal and k-terminal under zero-mode and one-mode components of the physical transmission line, respectively;

(3) comparing with the calculated differential current value of the travelling wave at one-mode components under the current time t and the same at time t-$t_0$ based on the following criteria:

$$dI_{j1}(t) > K \cdot dI_{j1}(t-t_0) \text{ or } dI_{k1}(t) > K \cdot dI_{k1}(t-t_0)$$

Where k is a reliability coefficient, the value of which is between 1.5 and 2; to represents the length of time to select data from current time; and it is determined that the DC physical transmission line is faulty if the criteria are satisfied at three consecutive sampling points, and the method proceeds to the next step;

(4) converting the differential current values of the travelling wave at the j-terminal and k-terminal under the mode components to differential current values $dI_{jp}(t)$, $dI_{jn}(t)$, $dI_{kp}(t)$, $dI_{kn}(t)$ under the maximum amount, respectively;

(5) calculating the fault type coefficients of both terminals of the transmission line, respectively:

$$j\text{-terminal: } B_j(t) = \frac{dI_{jp}(t) + dI_{jn}(t)}{dI_{jp}(t) - dI_{jn}(t)}$$

$$k\text{-terminal: } B_k(t) = \frac{dI_{kp}(t) + dI_{kn}(t)}{dI_{kp}(t) - dI_{kn}(t)};$$

(6) setting a small positive number a, and identifying the fault types based on the fault type coefficients:
 ① If the absolute value of the fault type coefficient at the j-terminal or k-terminal is less than a, identifying the fault type is pole-to-pole fault;
 ② If the absolute value of the fault type coefficient at the j-terminal or k-terminal is greater than a, identifying the fault type is positive-pole-to-ground fault;
 ③ If the absolute value of the fault type coefficient at the j-terminal or k-terminal is less than -a, identifying the fault type is negative-pole-to-ground fault;
Where the value of a can be 0.01.

Due to the long transmission distance of the HVDC physical transmission line, the probability of line failure is high, and the traditional protection principle cannot meet the requirements of the HVDC physical transmission line. The present disclosure first identifies whether a DC physical transmission line region is faulty by using the differential current of traveling wave at one-mode components, and then identifies the fault type according to the protective criteria achieved by the differential current values under the maximum amount, thereby facilitating accurate identification of the faulty lines. The method of the present disclosure is not affected by the fault location and has high resistance against transition resistance.

BRIEF DESCRIPTION OF THE DRAWINGS

The accompanying drawings illustrate one or more embodiments of the present invention and, together with the FIG. 1 shows a single HVDC physical transmission line fault diagram.

DETAILED DESCRIPTION OF THE EMBODIMENTS

Figure 1:
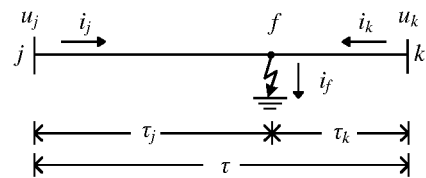

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of the method will now be presented with reference to various embodiments. The method will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

The principles and methods of the present disclosure will now be described in detail with reference to the accompanying drawings.

The present disclosure provides a Bergeron model based technical scheme which identifies whether a DC physical transmission line is faulty by using the differential current value under the mode components, and then identifies the fault types according to the protective criteria achieved by the differential current values of travelling wave at positive and negative poles. The detailed technical scheme is as follows.

1. Principle of Identifying the Fault Types

As an accurate transmission line model, the Bergeron model reflects the relationship of the voltage and current between two ends of the physical transmission line when no fault is presented. In the case of fault occurred inside the transmission line, the physical transmission line is divided into two sections by the fault point, as shown in FIG. 1, and the relationship between voltage and current at two ends of the physical transmission line and the current at the fault point is shown in the following equation (1) and equation (2):

$$i_j(t) - \frac{u_j(t)}{Z_C} + i_k(t-\tau) + \frac{u_k(t-\tau)}{Z_C} = i_f(t-\tau_j) \quad (1)$$

$$i_k(t) - \frac{u_k(t)}{Z_C} + i_j(t-\tau) + \frac{u_j(t-\tau)}{Z_C} = i_f(t-\tau_k) \quad (2)$$

The equations (1) and (2) are derived from the single non-destructive transmission line. Wherein, $u_j$ and $i_j$ are the voltage value and the current value at j-terminal of the DC physical transmission line, respectively; $u_k$ and $i_k$ are the voltage value and the current value at k-terminal of the DC physical transmission line, respectively; $Z_C$ is line wave impedance, t is the time, $\tau$ is the time for the travelling wave to travel from one end of the line to the other thereof, $\tau_j$ is the time for the travelling wave to travel from the j-terminal of the line to the fault point, $\tau_k$ is the time for the travelling wave to travel from the k-terminal of the line to the fault point, $i_f$ is the current at the fault point. The details are shown in FIG. 1.

Figure 2:
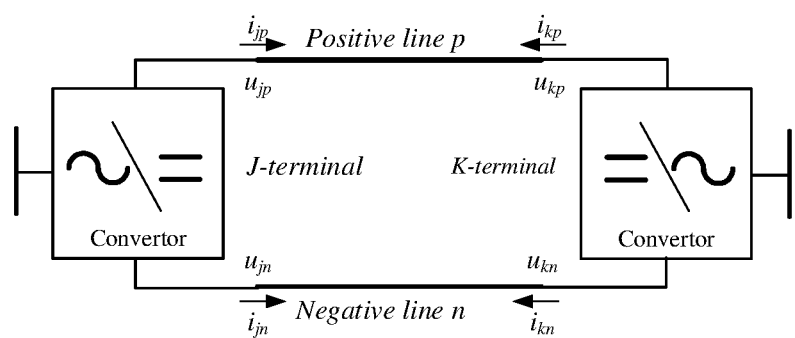
FIG. 2 shows a diagram of an HVDC physical transmission line.

For a HVDC transmission system, the physical transmission line usually comprises a positive physical transmission line and a negative physical transmission line. As shown in FIG. 2, two lines exist coupling therein, so when a fault occurred in the DC physical transmission line, the voltage and current at two ends and the current at the fault point cannot be directly substituted into the above equation (1) or equation (2) which are derived from the single transmission line, the decoupling matrix in equation (3) is applied firstly to decouple the amount of voltage and current of the transmission line.

$$S = S^{-1} = \frac{1}{\sqrt{2}} \begin{bmatrix} 1 & 1 \\ 1 & -1 \end{bmatrix} \quad (3)$$

The following equation (4) illustrates the use of decoupling equation by taking the current value at the j-terminal as an example. The decoupling of voltage value at the j-terminal, the voltage value and current value at the k-terminal and current value of the fault point work in a similar way.

$$\begin{bmatrix} i_{j0}(t) \\ i_{j1}(t) \end{bmatrix} = S^{-1} \cdot \begin{bmatrix} i_{jp}(t) \\ i_{jn}(t) \end{bmatrix} = \frac{1}{\sqrt{2}} \begin{bmatrix} 1 & 1 \\ 1 & -1 \end{bmatrix} \begin{bmatrix} i_{jp}(t) \\ i_{jn}(t) \end{bmatrix} \quad (4)$$

Where $i_{j0}$ is the current component at the j-terminal under zero-mode, $i_{j1}$ is the current component at the j-terminal under one-mode, $i_{jp}(t)$ is the positive current at the j-terminal and $i_{jn}(t)$ is the negative current at j-terminal.

The demodulated moduli do not exist coupling after demodulation, which are then substituted into the equation (1) to obtain a travelling wave differential current relationship when the DC physical transmission line is faulty at j-terminal, as shown in equation (5). When substituting the demodulated moduli into the equation (2), a differential current relationship at k-terminal can be achieved, and the analysis process is exactly the same as that of j-terminal. The present disclosure takes j-terminal as an example for analysis to simplify explanation.

$$\begin{bmatrix} i_{j0}(t) \\ i_{j1}(t) \end{bmatrix} - \frac{1}{Z_C} \begin{bmatrix} u_{j0}(t) \\ u_{j1}(t) \end{bmatrix} + \begin{bmatrix} i_{k0}(t-\tau_0) \\ i_{k1}(t-\tau_1) \end{bmatrix} + \frac{1}{Z_C} \begin{bmatrix} u_{k0}(t-\tau_0) \\ u_{k1}(t-\tau_1) \end{bmatrix} = \begin{bmatrix} i_{f0}(t-\tau_{j0}) \\ i_{f1}(t-\tau_{j1}) \end{bmatrix} \quad (5)$$

Where $u_{j0}$ is the voltage component at the j-terminal under zero-mode; $u_{j1}$ is the voltage component at the j-terminal under one-mode; $i_{k0}$ is the current component at the k-terminal under zero-mode; $i_{k1}$ is the current component at the k-terminal under one-mode; $u_{k0}$ is the voltage component at the k-terminal under zero-mode; $u_{k1}$ is the voltage component at the k-terminal under one-mode; $\tau_0$ is the time for the travelling wave under zero-mode to travel from one end of the line to the other thereof; $\tau_1$ is the time for the travelling wave under one-mode to travel from one end of the line to the other thereof; $i_{f0}$ is the fault current component at zero-mode; and $i_{f1}$ is the fault current component at one-mode.

In order to facilitate the following analysis, taking $dI_{j0}$ and $dI_{j1}$ to represent the differential current of travelling wave at zero-mode and the differential current of travelling wave at one-mode, respectively, as shown in equation (6):

$$\begin{bmatrix} dI_{j0}(t) \\ dI_{j1}(t) \end{bmatrix} = \begin{bmatrix} i_{j0}(t) \\ i_{j1}(t) \end{bmatrix} - \frac{1}{Z_C} \begin{bmatrix} u_{j0}(t) \\ u_{j1}(t) \end{bmatrix} + \begin{bmatrix} i_{k0}(t-\tau_0) \\ i_{k1}(t-\tau_1) \end{bmatrix} + \frac{1}{Z_C} \begin{bmatrix} u_{k0}(t-\tau_0) \\ u_{k1}(t-\tau_1) \end{bmatrix}; \quad (6)$$

Further, $$\begin{bmatrix} dI_{j0}(t) \\ dI_{j1}(t) \end{bmatrix} = \begin{bmatrix} i_{f0}(t-\tau_{j0}) \\ i_{f1}(t-\tau_{j1}) \end{bmatrix}; \quad (7)$$

Further, performing inverse transformation on the equation (7) to obtain the differential current under the maximum amount, as shown in equation (8);

$$\begin{bmatrix} dI_{jp}(t) \\ dI_{jn}(t) \end{bmatrix} = S \cdot \begin{bmatrix} dI_{j0}(t) \\ dI_{j1}(t) \end{bmatrix} = S \cdot \begin{bmatrix} i_{f0}(t-\tau_{j0}) \\ i_{f1}(t-\tau_{j1}) \end{bmatrix} \quad (8)$$

Where $dI_{jp}$ is the positive differential current of the travelling wave at j-terminal, and $dI_{jn}$ is the negative differential current of the travelling wave at j-terminal.

The fault types of the DC physical transmission line can be divided into three types: positive ground fault, negative ground fault and bipolar short circuit fault. The three types may obtain different equations (8), so the fault types will be further described and analyzed as follows.

1.1 Positive-Pole-to-Ground Fault

Figure 3:
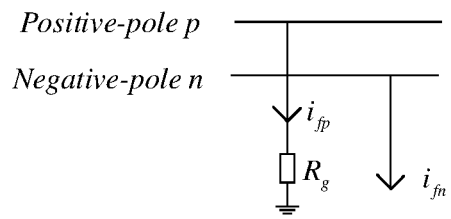
FIG. 3 shows a diagram of a transmission line having positive ground fault.

Assuming that the current at the fault point is $i_f$ and the positive direction of the fault current is from the line to the ground. This assumption is also applicable to the negative-pole-to-ground fault and pole-to-pole fault. When the positive-pole-to-ground fault occurred in the DC physical transmission line, as shown in FIG. 3, the current at the fault point has the relationship as follows:

$$\begin{bmatrix} i_{fp}(t) \\ i_{fn}(t) \end{bmatrix} = \begin{bmatrix} i_f(t) \\ 0 \end{bmatrix}; \quad (9)$$

The fault current is decoupled to obtain the fault currents under zero-mode and one-mode, respectively:

$$\begin{bmatrix} i_{f0}(t) \\ i_{f1}(t) \end{bmatrix} = S^{-1} \cdot \begin{bmatrix} i_{fp}(t) \\ i_{fn}(t) \end{bmatrix} = \frac{1}{\sqrt{2}} \begin{bmatrix} 1 & 1 \\ 1 & -1 \end{bmatrix} \cdot \begin{bmatrix} i_f(t) \\ 0 \end{bmatrix} = \frac{1}{\sqrt{2}} \begin{bmatrix} i_f(t) \\ i_f(t) \end{bmatrix}; \quad (10)$$

$t-\tau_{j0}$ and $t-\tau_{j1}$ are substituted to the equation (10) to obtain the relationship as follows:

$$\begin{bmatrix} i_{f0}(t-\tau_{j0}) \\ i_{f1}(t-\tau_{j1}) \end{bmatrix} = \frac{1}{\sqrt{2}} \begin{bmatrix} i_f(t-\tau_{j0}) \\ i_f(t-\tau_{j1}) \end{bmatrix}; \quad (11)$$

Further, the relationship of differential current, as shown in the equation (12), is obtained by the equation (8) and the equation (11) under positive-pole-to-ground fault situation:

$$\begin{bmatrix} dI_{jp}(t) \\ dI_{jn}(t) \end{bmatrix} = S \cdot \begin{bmatrix} i_{f0}(t-\tau_{j0}) \\ i_{f1}(t-\tau_{j1}) \end{bmatrix} = \frac{1}{\sqrt{2}} \begin{bmatrix} 1 & 1 \\ 1 & -1 \end{bmatrix} \cdot \frac{1}{\sqrt{2}} \begin{bmatrix} i_f(t-\tau_{j0}) \\ i_f(t-\tau_{j1}) \end{bmatrix} = \frac{1}{2} \begin{bmatrix} i_f(t-\tau_{j0}) + i_f(t-\tau_{j1}) \\ i_f(t-\tau_{j0}) - i_f(t-\tau_{j1}) \end{bmatrix}. \quad (12)$$

1.2 Negative-Pole-to-Ground Fault

Figure 4:
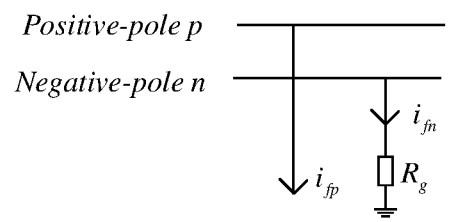
FIG. 4 shows a diagram of a transmission line having negative ground fault.

When the negative-pole-to-ground fault occurred in the DC physical transmission line, as shown in FIG. 4, the current at the fault point has the relationship as follows:

$$\begin{bmatrix} i_{fp}(t) \\ i_{fn}(t) \end{bmatrix} = \begin{bmatrix} 0 \\ -i_f(t) \end{bmatrix} \quad (13)$$

The fault current is decoupled to obtain the fault currents under zero-mode and one-mode, respectively:

$$\begin{bmatrix} i_{f0}(t) \\ i_{f1}(t) \end{bmatrix} = S^{-1} \cdot \begin{bmatrix} i_{fp}(t) \\ i_{fn}(t) \end{bmatrix} = \frac{1}{\sqrt{2}} \begin{bmatrix} 1 & 1 \\ 1 & -1 \end{bmatrix} \cdot \begin{bmatrix} 0 \\ -i_f(t) \end{bmatrix} = \frac{1}{\sqrt{2}} \begin{bmatrix} -i_f(t) \\ i_f(t) \end{bmatrix} \quad (14)$$

$t-\tau_{j0}$ and $t-\tau_{j1}$ are substituted to the equation (14) to obtain the relationship as follows:

$$\begin{bmatrix} i_{f0}(t-\tau_{j0}) \\ i_{f1}(t-\tau_{j1}) \end{bmatrix} = \frac{1}{\sqrt{2}} \begin{bmatrix} -i_f(t-\tau_{j0}) \\ i_f(t-\tau_{j1}) \end{bmatrix} \quad (15)$$

Further, the relationship of differential current, as shown in the equation (16), is obtained by the equation (8) and the equation (15) under negative ground fault situation:

$$\begin{bmatrix} dI_p(t) \\ dI_n(t) \end{bmatrix} = S \cdot \begin{bmatrix} i_{f0}(t-\tau_{j0}) \\ i_{f1}(t-\tau_{j1}) \end{bmatrix} = \frac{1}{\sqrt{2}} \begin{bmatrix} 1 & 1 \\ 1 & -1 \end{bmatrix} \cdot \frac{1}{\sqrt{2}} \begin{bmatrix} -i_f(t-\tau_{j0}) \\ i_f(t-\tau_{j1}) \end{bmatrix} = \frac{1}{2} \begin{bmatrix} -i_f(t-\tau_{j0}) + i_f(t-\tau_{j1}) \\ -i_f(t-\tau_{j0}) - i_f(t-\tau_{j1}) \end{bmatrix}. \quad (16)$$

1.3 Pole-to-Pole Fault

Figure 5:
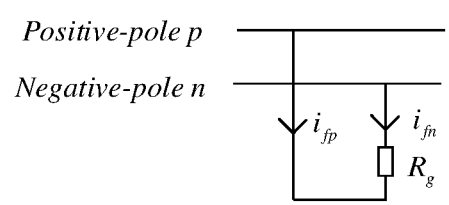
FIG. 5 shows a diagram of a transmission line having bipolar short circuit fault.

When the pole-to-pole fault occurred in the DC physical transmission line, as shown in FIG. 5, the current at the fault point has the relationship as follows:

$$\begin{bmatrix} i_{fp}(t) \\ i_{fn}(t) \end{bmatrix} = \begin{bmatrix} i_f(t) \\ -i_f(t) \end{bmatrix} \quad (17)$$

The fault current is decoupled to obtain the fault currents under zero-mode and one-mode, respectively:

$$\begin{bmatrix} i_{f0}(t) \\ i_{f1}(t) \end{bmatrix} = S^{-1} \cdot \begin{bmatrix} i_{fp}(t) \\ i_{fn}(t) \end{bmatrix} = \frac{1}{\sqrt{2}} \begin{bmatrix} 1 & 1 \\ 1 & -1 \end{bmatrix} \cdot \begin{bmatrix} i_f(t) \\ -i_f(t) \end{bmatrix} = \frac{1}{\sqrt{2}} \begin{bmatrix} 0 \\ 2i_f(t) \end{bmatrix} \quad (18)$$

$t-\tau_{j0}$ and $t-\tau_{j1}$ are substituted to the equation (18) to obtain the relationship as:

$$\begin{bmatrix} i_{f0}(t-\tau_{j0}) \\ i_{f1}(t-\tau_{j1}) \end{bmatrix} = \frac{1}{\sqrt{2}} \begin{bmatrix} 0 \\ 2i_f(t-\tau_{j1}) \end{bmatrix} \quad (19)$$

Further, the relationship of differential current, as shown in the equation (20), is obtained by the equation (8) and the equation (19) under pole-to-pole fault situation:

$$\begin{bmatrix} dI_p(t) \\ dI_n(t) \end{bmatrix} = S \cdot \begin{bmatrix} i_{f0}(t-\tau_{j0}) \\ i_{f1}(t-\tau_{j1}) \end{bmatrix} = \frac{1}{\sqrt{2}} \begin{bmatrix} 1 & 1 \\ 1 & -1 \end{bmatrix} \cdot \frac{1}{\sqrt{2}} \begin{bmatrix} 0 \\ 2i_f(t-\tau_{j1}) \end{bmatrix} = \begin{bmatrix} i_f(t-\tau_{j1}) \\ -i_f(t-\tau_{j1}) \end{bmatrix}. \quad (20)$$

2. Method for Identifying the Fault Types

It can be seen from equations (12), (16) and (20) that the differential currents of the three fault types have significant differences, so the following fault types identification method is designed. The method includes the following steps:

(1) measuring positive and negative voltage values $u_{jp}$, $u_{jn}$, $u_{kp}$, $u_{kn}$ and positive and negative current values $i_{jp}$, $i_{jn}$, $i_{kp}$, $i_{kn}$ at the j-terminal and k-terminal of the DC physical transmission line with a physical voltage meter and a physical current meter, respectively, and converting the measured voltage and current values under the maximum amount to voltage and current values $u_{j0}$, $u_{j1}$, $u_{k0}$, $u_{k1}$, $i_{j0}$, $i_{j1}$, $i_{k0}$, $i_{k1}$ under the mode components by employing the decoupling matrix with a first physical convertor or a first convertor embedded in a first circuitry;

(2) calculating the differential current values $dI_{j0}(t)$, $dI_{j1}(t)$, $dI_{k0}(t)$, $dI_{k1}(t)$ of the travelling wave at the j-terminal and k-terminal under zero-mode and one-mode components of the transmission line, respectively with a processing system;

(3) comparing, executed by the processing system, with the calculated differential current value of the travelling wave at one-mode components under the current time t and the same at time $t-t_0$ based on the following criteria:

$$dI_{j1}(t) > K \cdot dI_{j1}(t-t_0) \text{ or } dI_{k1}(t) > K \cdot dI_{k1}(t-t_0)$$

Where k is a reliability coefficient, in order to ensure the reliability of the above criteria in the case of high-resistance short-circuit faults, and meanwhile have certain sensitivity, the value of the reliability coefficient may be between 1.5 and 2; $t_0$ represents the length of time to select data from current time, the value of which can be $t_0=2$ ms. If the above criteria are satisfied at three consecutive sampling points, it is determined that the DC physical transmission line is faulty, and the method proceeds to the next step; otherwise, it is determined that the DC physical transmission line has not fault, and the method returns back to steps (1) to (3);

(4) converting the differential current values of the travelling wave at the j-terminal and k-terminal under the mode components to differential current values under the maximum amount by the following equations, respectively with a second physical convertor or a second convertor embedded in a second circuitry;

$$j\text{-terminal: } \begin{bmatrix} dI_{jp}(t) \\ dI_{jn}(t) \end{bmatrix} = S \cdot \begin{bmatrix} dI_{j0}(t) \\ dI_{j1}(t) \end{bmatrix}$$

$$k\text{-terminal: } \begin{bmatrix} dI_{kp}(t) \\ dI_{kn}(t) \end{bmatrix} = S \cdot \begin{bmatrix} dI_{k0}(t) \\ dI_{k1}(t) \end{bmatrix}$$

(5) calculating, by the processing system, the fault type coefficients of both terminals of the physical transmission line according to the results of steps (4), respectively:

$$j\text{-terminal: } B_j(t) = \frac{dI_{jp}(t) + dI_{jn}(t)}{dI_{jp}(t) - dI_{jn}(t)}$$

-continued k-terminal: $B_k(t) = \dfrac{dI_{kp}(t) + dI_{kn}(t)}{dI_{kp}(t) - dI_{kn}(t)};$ Illustrating the characteristics of three fault types by taking the fault type coefficients at j-terminal as an example as follows:

① Positive-pole-to-ground fault $B_j(t) = \dfrac{dI_{jp}(t) + dI_{jn}(t)}{dI_{jp}(t) - dI_{jn}(t)} = \dfrac{i_f(t - \tau_{j0})}{i_f(t - \tau_{j1})}$ ② Negative-pole-to-ground fault $B_j(t) = \dfrac{dI_{jp}(t) + dI_{jn}(t)}{dI_{jp}(t) - dI_{jn}(t)} = -\dfrac{i_f(t - \tau_{j0})}{i_f(t - \tau_{j1})}$ ③ Pole-to-pole fault $B_j(t) = \dfrac{dI_{jp}(t) + dI_{jn}(t)}{dI_{jp}(t) - dI_{jn}(t)} = 0;$ Identifying the fault types based on the above fault type coefficients:

① If the fault type coefficient value at the j-terminal or k-terminal equals to 0, identifying that the fault type is a pole-to-pole fault; considering the factors, such as sampling error, in the actual protection devices, the fault type coefficient values at both ends under pole-to-pole fault may be not necessarily equal to 0, the absolute value of the fault type coefficient is considered to be 0 if it is within the range of 0.01;

② If the absolute value of the fault type coefficient at the j-terminal or k-terminal is greater than 0.01, identifying that the fault type is positive-pole-to-ground fault;

③ If the absolute value of the fault type coefficient at the j-terminal or k-terminal is less than −0.01, identifying that the fault type is negative-pole-to-ground fault.

The above specific embodiments are merely illustrative of the structure of the present disclosure, and various modifications and variations can be made by those common skilled in the art under the concept of the present disclosure, and should be included within the scope of the present disclosure.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method for identifying fault types of an HVDC physical transmission line, including the following steps:
   (1) measuring positive and negative voltage values $u_{jp}$, $u_{jn}$, $u_{kp}$, $u_{kn}$ and positive and negative current values $i_{jp}$, $i_{jn}$, $i_{kp}$, $i_{kn}$ at j-terminal and a k-terminal of the HVDC physical transmission line with a physical voltage meter and a physical current meter, and converting the measured voltage and current values under the maximum amount to voltage and current values $u_{j0}$, $u_{j1}$, $u_{k0}$, $u_{k1}$, $i_{j0}$, $i_{j1}$, $i_{k0}$, $i_{k1}$ under mode components by employing decoupling matrix with a first convertor embedded in a first circuitry;
   (2) calculating, by a processing system, the differential current values $dI_{j0}(t)$, $dI_{j1}(t)$, $dI_{k0}(t)$, $dI_{k1}(t)$ of travelling wave at the j-terminal and k-terminal under zero-mode and one-mode components of the HVDC physical transmission line, respectively;
   (3) comparing with the calculated differential current value of the travelling wave at the one-mode components under the current time t and the same at time t-$t_0$ based on the following criteria:

$dI_{j1}(t) > K \cdot dI_{j1}(t-t_0)$ or $dI_{k1}(t) > K \cdot dI_{k1}(t-t_0)$

Where k is a reliability coefficient, the value of which is between 1.5 and 2; $t_0$ represents the length of time to select data from current time; and it is determined that the HVDC physical transmission line is faulty if the criteria are satisfied at three consecutive sampling points, and then the method proceeds to the next step;
   (4) converting the differential current values of the travelling wave at the j-terminal and k-terminal under the mode components to differential current values $dI_{jp}(t)$, $dI_{jn}(t)$, $dI_{kp}(t)$, $dI_{kn}(t)$ under the maximum amount, respectively with a second convertor embedded in a second circuitry;
   (5) calculating, by the processing system, fault type coefficients of both terminals of the HVDC physical transmission line, respectively:

j-terminal $B_j(t) = \dfrac{dI_{jp}(t) + dI_{jn}(t)}{dI_{jp}(t) - dI_{jn}(t)}$;

k-terminal $B_k(t) = \dfrac{dI_{kp}(t) + dI_{kn}(t)}{dI_{kp}(t) - dI_{kn}(t)}$; and (6) setting a small positive number a, and identifying, by the processing system, the fault types based on the fault type coefficients:

① if the absolute value of the fault type coefficient at the j-terminal or k-terminal is less than a, identifying, by the processing system, a fault type is pole-to-pole fault;

② if the absolute value of the fault type coefficient at the j-terminal or k-terminal is greater than a, identifying, by the processing system, the fault type is positive-pole-to-ground fault;

③ if the absolute value of the fault type coefficient at the j-terminal or k-terminal is less than –a, identifying, by the processing system, the fault type is negative-pole-to-ground fault.

2. The method for identifying fault types of the HVDC physical transmission lines according to claim 1, wherein the value of a is 0.01.

\* \* \* \* \*